United States Patent
Lee (10) Patent No.: US 11,152,043 B2
(45) Date of Patent: Oct. 19, 2021

(54) SEMICONDUCTOR APPARATUS CAPABLE OF CONTROLLING THE TIMING OF DATA AND CONTROL SIGNALS RELATED TO DATA INPUT/OUTPUT

(71) Applicant: SK hynix Inc., Icheon-si Gyeonggi-do (KR)

(72) Inventor: Gang Sik Lee, Anyang-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 101 days.

(21) Appl. No.: 16/599,757

(22) Filed: Oct. 11, 2019

(65) Prior Publication Data

US 2020/0294563 A1 Sep. 17, 2020

(30) Foreign Application Priority Data

Mar. 12, 2019 (KR) .................. 10-2019-0027990

(51) Int. Cl.
*G11C 7/22* (2006.01)
*G11C 7/10* (2006.01)

(52) U.S. Cl.
CPC .............. *G11C 7/222* (2013.01); *G11C 7/109* (2013.01); *G11C 7/1063* (2013.01); *G11C 7/1096* (2013.01)

(58) Field of Classification Search
CPC ....... G11C 7/222; G11C 7/1063; G11C 7/109; G11C 7/1096
See application file for complete search history.

(56) References Cited

U.S. PATENT DOCUMENTS

| | | | | |
|---|---|---|---|---|
| 5,991,233 A | * | 11/1999 | Yu | G11C 7/1072 365/238.5 |
| 6,134,179 A | * | 10/2000 | Ooishi | G11C 8/18 365/233.14 |
| 9,236,111 B2 | * | 1/2016 | Cho | G11C 7/1093 |
| 9,432,298 B1 | * | 8/2016 | Smith | H04L 49/9057 |
| 2002/0093032 A1 | * | 7/2002 | Hanzawa | G11C 7/14 257/200 |
| 2014/0192583 A1 | * | 7/2014 | Rajan | G11C 5/06 365/63 |
| 2017/0060789 A1 | * | 3/2017 | Noda | G06F 13/1673 |

* cited by examiner

*Primary Examiner* — Sung Il Cho
(74) *Attorney, Agent, or Firm* — William Park & Associates Ltd.

(57) ABSTRACT

A semiconductor apparatus including: a peripheral circuit region and a memory region including a plurality of unit memory blocks coupled to the peripheral circuit region through data lines and control signal lines. The control signal lines having a path configuration configured to equalize a value corresponding to a difference between times required for transferring data from the peripheral circuit region to the plurality of unit memory blocks with another value corresponding to a difference between times required for transferring control signals related to data input/output from the peripheral circuit region to the plurality of unit memory blocks to substantially a same value.

19 Claims, 6 Drawing Sheets

SEMICONDUCTOR APPARATUS CAPABLE OF CONTROLLING THE TIMING OF DATA AND CONTROL SIGNALS RELATED TO DATA INPUT/OUTPUT

CROSS-REFERENCES TO RELATED APPLICATION

The present application claims priority under 35 U.S.C. § 119(a) to Korean application number 10-2019-0027990, filed on Mar. 12, 2019, in the Korean Intellectual Property Office, which is incorporated herein by reference in its entirety.

BACKGROUND

1. Technical Field

Various embodiments generally relate to a semiconductor circuit, and more particularly, to a semiconductor apparatus capable of controlling the timing of data and control signals related to data input/output.

2. Related Art

A semiconductor apparatus, for example, a semiconductor memory apparatus increases the number of prefetch bits to improve the operating speed of a memory region, and increases the number of input/output data to expand a bandwidth.

Thus, the semiconductor memory apparatus includes a plurality of input/output wirings. Among the plurality of input/output wirings, a plurality of global input/output lines which are coupled to the memory region after a prefetch operation for data DATA is finished require an enhanced data transfer rate and low power consumption.

The number of the global input/output lines corresponds to a value obtained by multiplying the number of data DATA by the number of prefetch bits. For example, an X16 data/16-bit prefetch semiconductor memory apparatus requires at least 256 global input/output lines.

Unit memory blocks included in the memory region, for example, unit memory blocks may be positioned at physically different distances from a data input/output-related component, for example, a pad, depending on the positions where the unit memory blocks are arranged.

Since a wiring structure of a global input/output line for inputting/outputting data DATA to/from the unit memory blocks is different from a wiring structure of a line for signals for controlling data input/output, for example, a command and address signal, a time skew may occur between the data DATA and the signal for controlling data input/output. For example, unlike the line for the command and address signal which is wired in a tree shape, the global input/output line which requires a relatively large number of lines cannot be wired in a tree shape, and thus is wired in a fly-by manner. Therefore, a time skew may occur between the data DATA and the signal for controlling data input/output. In order to compensate for the time skew, a delay circuit or the like may be used in the wiring line. However, it is difficult to accurately compensate for the time skew, while power consumption is increased by the use of the delay circuit.

SUMMARY

In an embodiment, a semiconductor apparatus may include: a peripheral circuit region; and a memory region including a plurality of unit memory blocks coupled to the peripheral circuit region through data lines and control signal lines. The control signal lines may have a path configuration configured to equalize a value corresponding to a difference between times required for transferring data from the peripheral circuit region to the plurality of unit memory blocks with another value corresponding to a difference between times required for transferring control signals related to data input/output from the peripheral circuit region to the plurality of unit memory blocks to substantially a same value.

In an embodiment, a semiconductor apparatus may include: a peripheral circuit region; a memory region including a plurality of unit memory blocks; data lines configured to transfer data inputted from the outside through the peripheral circuit region to the plurality of unit memory blocks; first control signal lines extended from the peripheral circuit region to the unit memory block which is the farthest from the peripheral circuit region, and configured to transfer control signals related to data input/output to the plurality of unit memory blocks; second control signal lines diverging from the first control signal lines of the farthest unit memory block side and extended from the farthest unit memory block toward the unit memory block which is the closest to the peripheral circuit region, and configured to transfer the control signals; and one or more switching circuits configured to couple the first control signal lines to one or more of the plurality of unit memory blocks during a write operation of the semiconductor apparatus.

In an embodiment, a semiconductor apparatus may include: a peripheral circuit region; a memory region including a plurality of unit memory blocks; data lines configured to transfer data read from the plurality of unit memory blocks to the peripheral circuit region; first control signal lines extended from the peripheral circuit region to the unit memory block which is the farthest from the peripheral circuit region, and configured to transfer control signals related to data input/output to the plurality of unit memory blocks; second control signal lines diverging from the first control signal lines of the farthest unit memory block side and extended from the farthest unit memory block toward the unit memory block which is the closest to the peripheral circuit region, and configured to transfer the control signals; and one or more switching circuits configured to couple the second control signal lines to one or more of the plurality of unit memory blocks during a read operation of the semiconductor apparatus.

In an embodiment, a semiconductor apparatus may include: a peripheral circuit region; a memory region including a plurality of unit memory blocks; first data lines configured to transfer data inputted from the outside through the peripheral circuit region to the plurality of memory banks; second data lines configured to transfer data read from the plurality of unit memory blocks to the peripheral circuit region; first control signal lines extended from the peripheral circuit region to the unit memory block which is the farthest from the peripheral circuit region, and configured to transfer control signals related to data input/output to the plurality of unit memory blocks; second control signal lines diverging from the first control signal lines of the farthest unit memory block side and extended from the farthest unit memory block toward the unit memory block which is the closest to the peripheral circuit region, and configured to transfer the control signals; and one or more switching circuits configured to couple the first or second control signal lines to one or more of the plurality of unit memory blocks according to an operation state of the semiconductor apparatus.

DETAILED DESCRIPTION

Hereinafter, a semiconductor apparatuses according to the present disclosure will be described below with reference to the accompanying drawings through examples of embodiments.

Various embodiments may be directed to a semiconductor apparatus capable of minimizing a time skew between data and signals for controlling data input/output.

Figure 1:
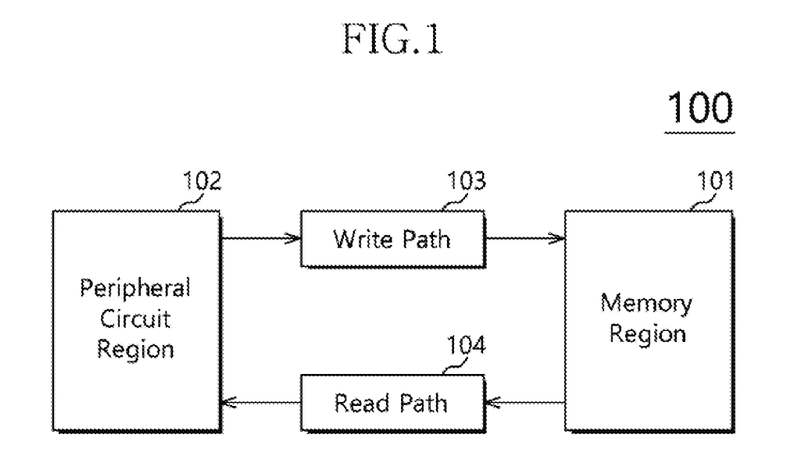
FIGS. 1 to 3 are diagrams illustrating configurations of semiconductor apparatuses in accordance with embodiments.
Figure 2:
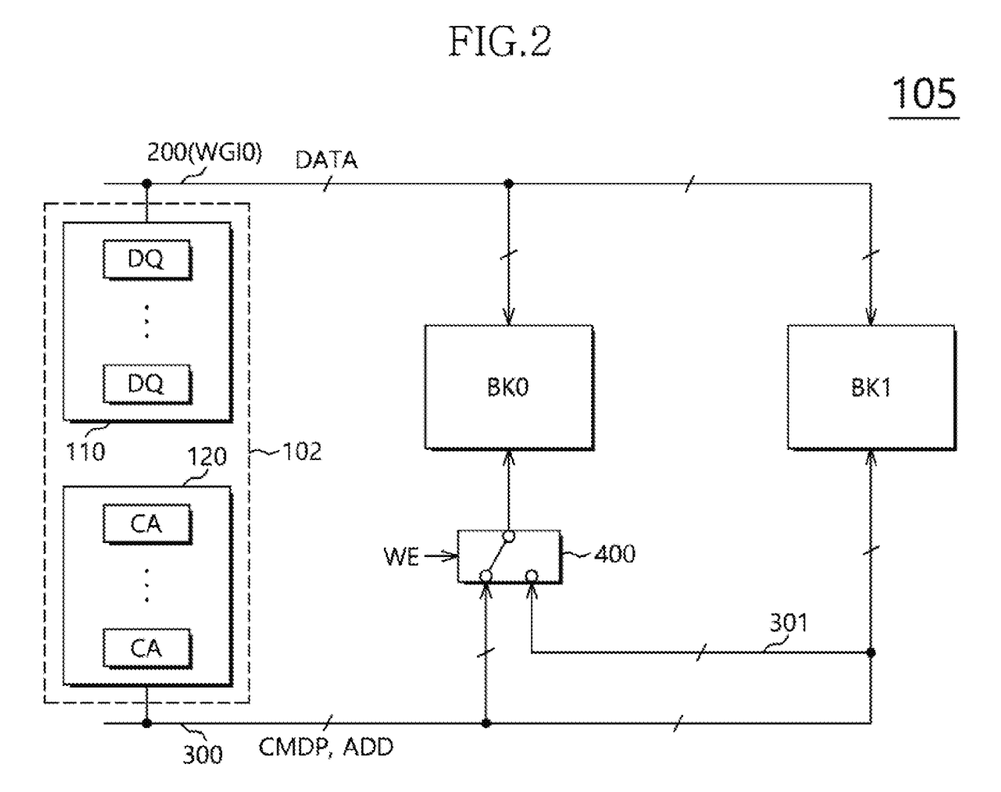
Figure 3:
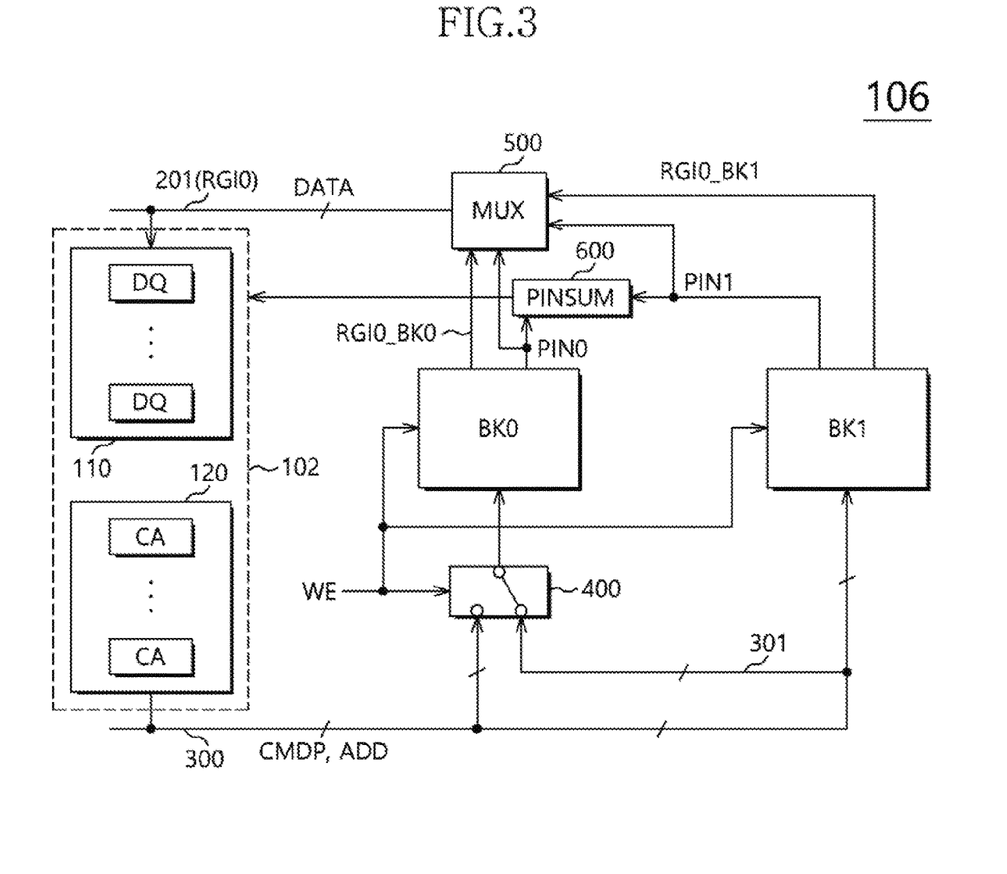

FIGS. 1 to 3 are diagrams illustrating configurations of semiconductor apparatuses in accordance with embodiments.

FIG. 1 is a diagram illustrating a configuration of a semiconductor apparatus 100 in accordance with an embodiment.

As illustrated in FIG. 1, the semiconductor apparatus 100 in accordance with an embodiment may include a memory region 101, a peripheral circuit region 102, a write path 103 and a read path 104.

The memory region 101 may include a plurality of memory cells and a plurality of circuits for storing data in the memory cells or reading data stored in the memory cells.

The plurality of memory cells may be divided into a plurality of unit memory blocks, for example, a plurality of memory banks.

The memory region 101 may further include circuits for sorting data in relation to a prefetch operation.

The peripheral circuit region 102 may include circuits related to a write operation of storing data inputted from the outside of the semiconductor apparatus in the memory region 101 and a read operation of outputting data read from the memory region 101 to the outside of the semiconductor apparatus.

The peripheral circuit region 102 may include data pads for data input/output with the outside of the semiconductor apparatus, command/address pads for receiving a command and address from the outside of the semiconductor apparatus, a decoder, and a pipe register for sorting data in relation to a prefetch operation.

The write path 103 may include circuits related to a write operation, for example, global input lines and signal lines for transferring commands and addresses.

The read path 104 may include circuits related to a read operation, for example, global output lines and signal lines for transferring commands and addresses.

FIG. 2 is a diagram illustrating a configuration of a semiconductor apparatus 105 related to a write operation in accordance with an embodiment.

Referring to FIG. 2, the semiconductor apparatus 105 related to the write operation in accordance with an embodiment may include a peripheral circuit region 102, first and second memory banks BK0 and BK1, data lines 200, control signal lines 300 and a switching circuit 400.

Hereafter, the data lines 200 will be referred to as first data lines to distinguish from data lines 200 which will be described below.

The peripheral circuit region 102 may include a first pad region 110 including a plurality of data pads DQ and a second pad region 120 including a plurality of command/address pads CA.

Although not illustrated, the peripheral circuit region 102 may further include a decoder and a pipe register for sorting data in relation to a prefetch operation.

The first and second memory banks BK0 and BK1 may be included in the memory region 101 of FIG. 1. The first memory bank BK0 may be positioned closer to the peripheral circuit region 102 than the second memory bank BK1 based on the peripheral circuit region 102.

The first data lines 200 may serve as signal lines for transferring data DATA inputted through the plurality of data pads DQ to the first and second memory banks BK0 and BK1 during a write operation.

The first data lines 200 may be arranged across the widest area and have the largest length, among the signal lines used in the semiconductor apparatus, and referred to as write global lines WGIO.

The control signal lines 300 may serve as signal lines for transferring control signals, i.e. a command strobe signal CMDP and an address signal ADD, to the first and second memory banks BK0 and BK1, the control signals being generated by decoding signals inputted through the plurality of command/address pads CA through the decoder.

The control signal lines 300 and 301 may extend from the peripheral circuit region 102 to the second memory bank BK1 further away from the peripheral circuit region 102 than the first memory bank BK0. Furthermore, the control signal lines 300 and 301 may be extended in the opposite direction from the extended position, that is, to the first memory bank BK0 closer to the peripheral circuit region 102 than the second memory bank BK1.

The control signal lines 300 and 301 may be divided into first control signal lines 300 and second control signal lines 301. The first control signal lines 300 may be extended from the peripheral circuit region 102 to the second memory bank BK1 which is the farthest memory bank from the peripheral circuit region 102, and the second control signal lines 301 may diverge from the first control signal lines 300 of the second memory bank BK1 side to be extended toward the first memory bank BK0 which is the closest memory bank to the peripheral circuit region 102.

The first data lines 200 and the first control signal lines 300 may be symmetrically arranged based on the first and second memory banks BK0 and BK1.

The switching circuit 400 may be configured to couple the first control signal lines 300 or the second control signal lines 301 to the first memory bank BK0 according to a write enable signal WE.

The write enable signal WE may have a first logic level (for example, high level) during a write operation, and have a second logic level (for example, low level) during a read operation. However, the embodiments are not limited in this way and the first logic level may be a low level during a write operation and the second logic level may be a high level during the read operation.

The switching circuit 400 may couple the first control signal lines 300 to the first memory bank BK0 when the write enable signal WE is at a high level, and couple the second control signal lines 301 to the first memory bank BK0 when the write enable signal WE is at a low level.

Since the second memory bank BK1 is positioned farther from the peripheral circuit region 102 than the first memory bank BK0, the first data lines 200 coupled to the second memory bank BK1 may have a longer length than the first data lines 200 coupled to the first memory bank BK0.

Therefore, during the write operation, a difference may occur between the time required for transferring data from the peripheral circuit region 102 to the first memory bank BK0 and the time required for transferring data from the peripheral circuit region 102 to the second memory bank BK1. That is, the time during which data transferred through the peripheral circuit region 102 is transferred to the second memory bank BK1 may be longer than the time during which the data is transferred to the first memory bank BK0.

At this time, the first data lines 200 may be distributed in a tree structure at an intermediate position between the first and second memory banks BK0 and BK1, in order to remove the data transfer time difference. As described above, however, the tree structure cannot be applied due to an increase in circuit area which occurs when the number of global lines is increased with the increase in the number of prefetch bits.

In an embodiment, through the above-described control signal lines 300 and 301, a difference between times required for transferring the control signals, i.e. the command strobe signal CMDP and the address signal ADD, to the first and second memory banks BK0 and BK1 and a difference between times required for transferring data to the first and second memory banks BK0 and BK1 may be equalized to the same value.

Since the write enable signal WE is at a high level during the write operation, the switching circuit 400 may couple the first control signal lines 300 to the first memory bank BK0.

Therefore, the command strobe signal CMDP and the address signal ADD may be transferred to the second memory bank BK1 at a later time than the first memory bank BK0 which is relatively close to the peripheral circuit region 102.

The first data lines 200 and the first control signal lines 300 may be designed symmetrically with respect to the first and second memory banks BK0 and BK1, and the directions in which the data DATA and the control signals are transferred during the write operation may be matched with each other. Therefore, the difference between the times required for transferring the data to the first and second memory banks and the difference between the times required for transferring the control signals to the first and second memory banks may be equalized to the same value. In an embodiment, the first data lines 200 and the first control signal lines 300 may be configured such that a value of a difference between times required for transferring data from the peripheral circuit region 102 to the plurality of unit memory blocks and a value of a difference between times required for transferring control signals related to data input/output from the peripheral circuit region 102 to the plurality of unit memory blocks are substantially the same value. In some embodiments, a path configuration of the control signal lines 300 may be configured such that a value of a difference between times required for transferring data from the peripheral circuit region 102 to the plurality of unit memory blocks and a value of a difference between times required for transferring control signals related to data input/output from the peripheral circuit region 102 to the plurality of unit memory blocks are substantially the same value. For example, the first data lines 200 and the first control signal lines 300 may be designed symmetrically with respect to the first and second memory banks BK0 and BK1, and the directionality based on the path configurations in which the data DATA and the control signals are transferred during the write operation may be matched with each other. For example, the first data lines 200 and the first control signal lines 300 may be designed symmetrically with respect to the first and second memory banks BK0 and BK1, and the distances in which the data DATA and the control signals are transferred during the write operation may be matched with each other. Therefore, the difference between the times required for transferring the data to the first and second memory banks and the difference between the times required for transferring the control signals to the first and second memory banks may be equalized to the same value based on the path configuration of the control signal lines.

FIG. 3 is a diagram illustrating a configuration of a semiconductor apparatus 106 related to a read operation in accordance with an embodiment.

Referring to FIG. 3, the semiconductor apparatus 106 related to the read operation in accordance with an embodiment may include a peripheral circuit region 102, first and second memory banks BK0 and BK1, data lines 201, control signal lines 300 and a switching circuit 400.

Hereafter, the data lines 201 will be referred to as second data lines 201.

The semiconductor apparatus 106 may further include a multiplexer (MUX) 500 and a sorting control signal summation (PINSUM) circuit 600.

The peripheral circuit region 102, the control signal lines 300 and the switching circuit 400 may be configured in the same manner as those illustrated in FIG. 2.

The second data lines 201 may be signal lines for transferring data outputted from the first and second memory banks BK0 and BK1 to the peripheral circuit region 102 during a read operation.

The second data lines 201 may be arranged across the widest area and have the longest length, among signal lines used in the semiconductor apparatus, like the first data lines 200 of FIG. 2, and referred to as read global lines RGIO.

The second data lines 201 and the control signal lines 300 and 301 may be arranged symmetrically with respect to the first and second memory banks BK0 and BK1.

The first memory bank BK0 may generate a first sorting control signal PIN0 for defining output timing of data RGIO_BK0 (hereafter, first output data) outputted therefrom according to the read operation.

The second memory bank BK1 may generate a second sorting control signal PIN1 for defining output timing of data RGIO_BK1 (hereafter, second output data) outputted therefrom according to the read operation.

The multiplexer 500 may select the first or second output data RGIO_BK0 or RGIO_BK1 and output the selected data, according to the first and second sorting control signals PIN0 and PIN1.

The multiplexer 500 may select the first output data RGIO_BK0 and output the selected data, when the first sorting control signal PIN0 of the first and second sorting control signals PIN0 and PIN1 is activated.

The multiplexer 500 may select the second output data RGIO_BK1 and output the selected data, when the second sorting control signal PIN1 of the first and second sorting control signals PIN0 and PIN1 is activated.

The sorting control signal summation circuit 600 may sum the first and second sorting control signals PIN0 and PIN1 and output the summation result.

The sorting control signal summation circuit 600 may include logic gates configured to perform an OR operation, for example.

Since the second memory bank BK1 is positioned farther from the peripheral circuit region 102 than the first memory bank BK0, the second data lines 201 coupled to the second memory bank BK1 may have a longer length than the second data lines 201 coupled to the first memory bank BK0.

Therefore, during the read operation, a difference may occur between times required for transferring the first and second output data RGIO_BK0 and RGIO_BK1 outputted from the first and second memory banks BK0 and BK1 to the peripheral circuit region 102. That is, the second output data RGIO_BK1 may be transferred to the peripheral circuit region 102 at a later time than the first output data RGIO_BK0.

In an embodiment, through the above-described control signal lines 300 and 301, the difference between the times required for transferring the control signals, i.e. the command strobe signal CMDP and the address signal ADD, to the first and second memory banks BK0 and BK1 and the difference between the times required for transferring the first and second output data RGIO_BK0 and RGIO_BK1 to the peripheral circuit region 102 may be equalized to the same value.

Since the write enable signal WE is at a low level during the read operation, the switching circuit 400 may couple the second control signal lines 301 to the first memory bank BK0.

Therefore, the control signals, i.e. the command strobe signal CMDP and the address signal ADD, may be first transferred to the second memory bank BK1 through the first control signal lines 300, and then transferred to the first memory bank BK0 through the second control signal lines 301.

That is, during the read operation, the control signals may be first transferred to the second memory bank BK1 which requires a relatively long time to output data, and then transferred to the first memory bank BK0 which requires a relatively short time to output data.

Since the second data lines 201 and the control signal lines 300 and 301 are designed symmetrically with respect to the first and second memory banks BK0 and BK1, the data transfer time difference and the control signal transfer time difference may be equalized to the same value during the read operation.

Figure 4:
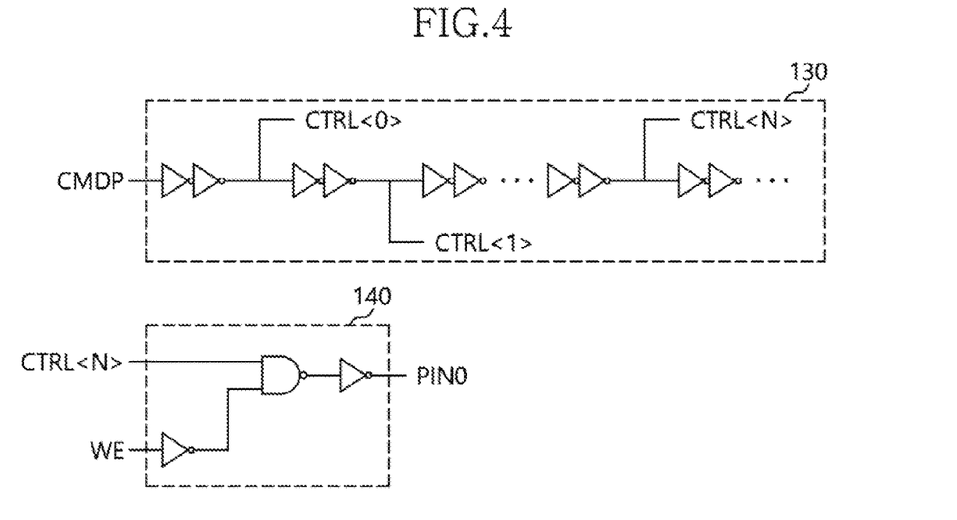
FIG. 4 is a diagram illustrating a configuration of a sorting control signal generation circuit in accordance with an embodiment.

FIG. 4 is a diagram illustrating a configuration of a sorting control signal generation circuit in accordance with an embodiment.

The first and second memory banks BK0 and BK1 may include sorting control signal generation circuits for generating the first and second sorting control signals PIN0 and PIN1, respectively.

For example, referring to FIG. 4, the sorting control signal generation circuit for generating the first sorting control signal PIN0 may include a delay circuit 130 and a combination circuit 140.

The delay circuit 130 may generate a plurality of delayed signals CTRL<0:N> by sequentially delaying the command strobe signal CMDP of the control signals through a plurality of inverters.

The combination circuit 140 may perform an AND operation on any one of the plurality of delayed signals CTRL<0:N> (for example, CTRL<N>) and an inverted signal of the write enable signal WE, and output the AND operation result as the first sorting control signal PIN0.

The value of the delayed signal CTRL<N> may be varied according to operation timing of the first memory bank BK0.

Since the write enable signal WE is at a low level during the read operation, the combination circuit 140 may output the delayed signal CTRL<N> as the first sorting control signal PIN0.

On the other hand, since the write enable signal WE is at a high level during the write operation, the combination circuit 140 may retain the first sorting control signal PIN0 at a low level regardless of the delayed signal CTRL<N>.

Figure 5A:
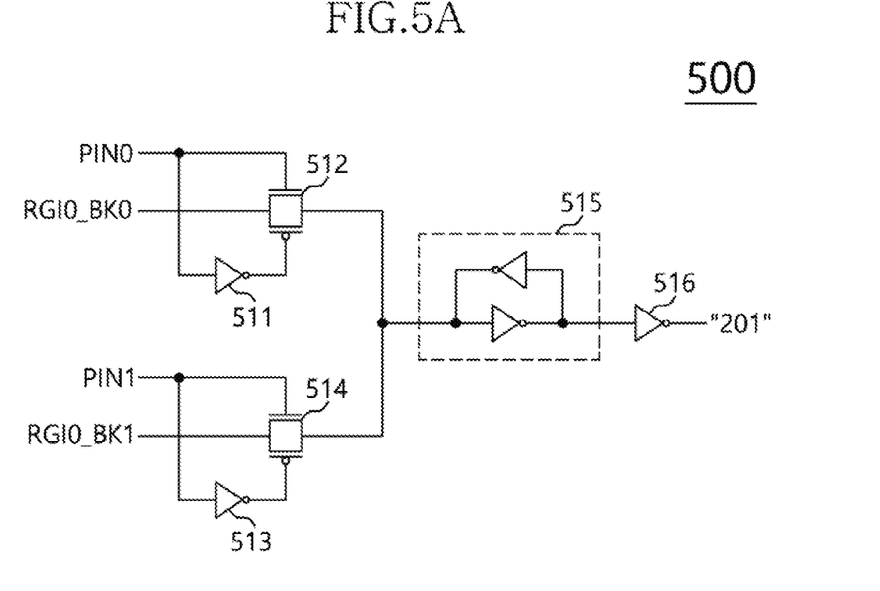
FIGS. 5A and 5B are diagrams illustrating configurations of multiplexers in accordance with embodiments.
Figure 5B:
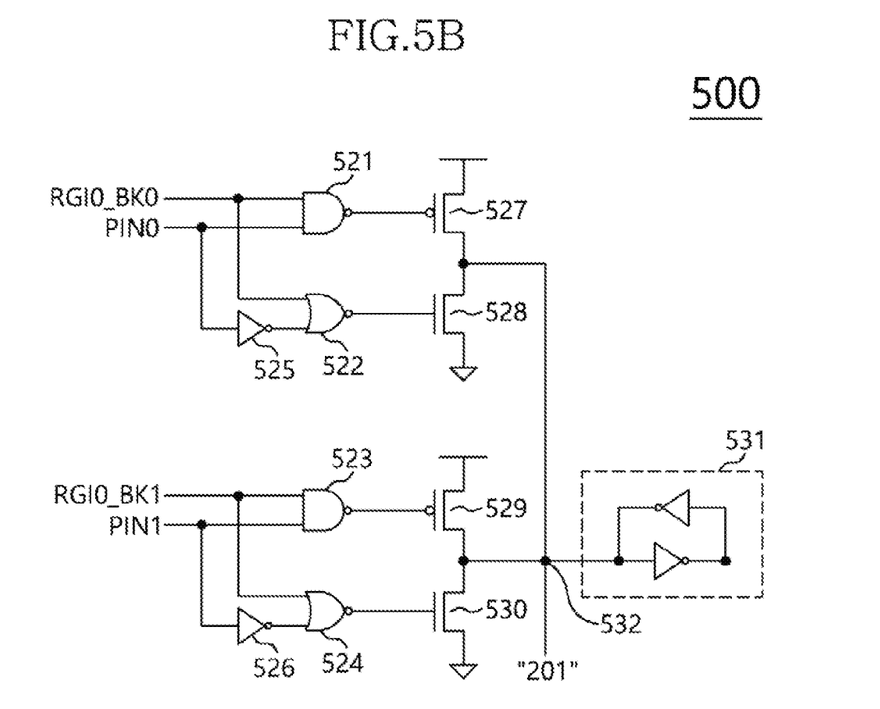

FIGS. 5A and 5B are diagrams illustrating configurations of multiplexers in accordance with embodiments.

The multiplexer 500 in accordance with an embodiment may be configured as illustrated in FIG. 5A.

Referring to FIG. 5A, the multiplexer 500 in accordance with an embodiment may include first and second pass gates 512 and 514, a latch 515 and first to third inverters 511, 513 and 516.

The first inverter 511 may invert the first sorting control signal PIN0 and output the inverted signal.

When the first sorting control signal PIN0 is at a high level, the first pass gate 512 may pass the first output data RGIO_BK0.

The second inverter 513 may invert the second sorting control signal PIN1 and output the inverted signal.

When the second sorting control signal PIN1 is at a high level, the second pass gate 514 may pass the second output data RGIO_BK1.

The latch 515 may have an input terminal coupled to output terminals of the first and second pass gates 512 and 514 in common.

The third inverter 516 may invert an output terminal level of the latch 515 and output the inverted signal.

The multiplexer 500 of FIG. 5A may select and output the first output data RGIO_BK0, when the first sorting control signal PIN0 of the first and second sorting control signals PIN0 and PIN1 is activated, and select and output the second output data RGIO_BK1 when the second sorting control signal PIN1 is activated.

The multiplexer 500 in accordance with an embodiment may be configured as illustrated in FIG. 5B.

Referring to FIG. 5B, the multiplexer 500 in accordance with an embodiment may include first to fourth logic gates 521 to 524, first and second inverters 525 and 526, first to fourth transistors 527 to 530 and a latch 531.

The first inverter 525 may invert the first sorting control signal PIN0 and output the inverted signal.

The second inverter 526 may invert the second sorting control signal PIN1 and output the inverted signal.

The first logic gate 521 may perform a NAND operation on the first output data RGIO_BK0 and the first sorting control signal PIN0, and output the NAND operation result.

The second logic gate 522 may perform a NOR operation on the first output data RGIO_BK0 and the output signal of the first inverter 525, and output the NOR operation result.

The third logic gate 523 may perform a NAND operation on the second output data RGIO_BK1 and the second sorting control signal PIN1, and output the NAND operation result.

The fourth logic gate 524 may perform a NOR operation on the second output data RGIO_BK1 and the output signal of the second inverter 526, and output the NOR operation result.

The first transistor 527 may drive an output terminal 532 to a power supply terminal level according to the output of the first logic gate 521.

The second transistor 528 may drive the output terminal 532 to a ground terminal level according to the output of the second logic gate 522.

The third transistor 529 may drive the output terminal 532 to the power supply terminal level according to the output of the third logic gate 523.

The fourth transistor 530 may drive the output terminal 532 to the ground terminal level according to the output of the fourth logic gate 524.

The latch 531 may be coupled to the output terminal 532, and retain the level of the output terminal 532.

The multiplexer 500 of FIG. 5B may select and output the first output data RGIO_BK0, when the first sorting control signal PIN0 of the first and second sorting control signals PIN0 and PIN1 is activated, and select and output the second output data RGIO_BK1 when the second sorting control signal PIN1 is activated.

Figure 6:
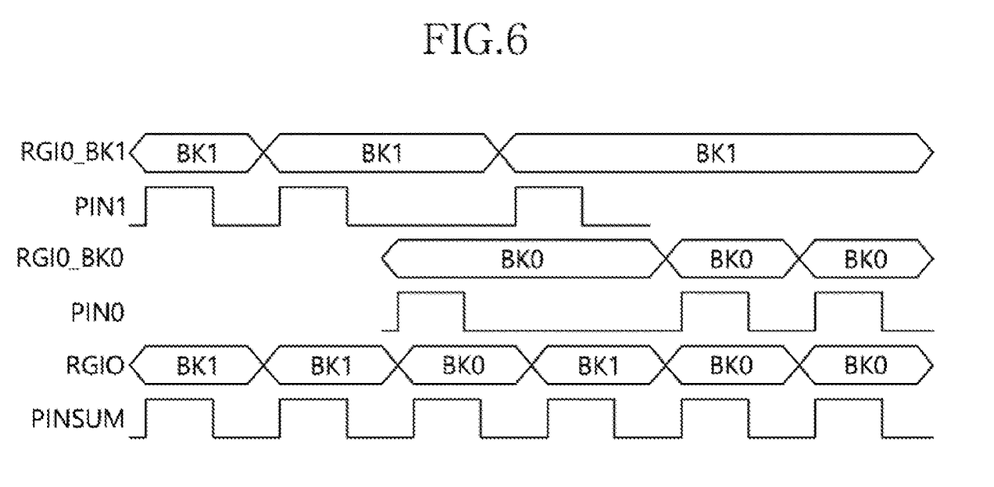
FIG. 6 is a diagram illustrating an example of a read operation in accordance with an embodiment.

FIG. 6 is a diagram illustrating an example of the read operation in accordance with an embodiment.

As described above, reference numerals BK0, BK1, RGIO_BK0, RGIO_BK1, PIN0 and PIN1 represent the first memory bank, the second memory bank, the first output data, the second output data, the first sorting control signal and the second sorting control signal, respectively. Therefore, for convenience of description, the following descriptions will be provided based on the reference numerals.

An example in which sequential read operations for BK1-BK1-BK0-BK1-BK0-BK0 are performed will be described with reference to FIG. 6.

Through the above-described sequential read operations, the data may be outputted from the memory banks BK0 and BK1 in order of RGIO_BK1-RGIO_BK1-RGIO_BK0-RGIO_BK1-RGIO_BK0-RGIO_BK0, and the sorting control signals may be generated in order of PIN1-PIN1-PIN0-PIN1-PIN0-PIN0.

The multiplexer 500 may select and output one of the data RGIO_BK1 and RGIO_BK0 according to the sorting control signals PIN1 and PIN0.

Through the data lines RGIO, the data may be transferred to the peripheral circuit region 102 in order of RGIO_BK1-RGIO_BK1-RGIO_BK0-RGIO_BK1-RGIO_BK0-RGIO_BK0. At this time, the first and second sorting control signals PIN0 and PIN1 summed by the sorting control signal summation circuit 600 may be transferred to the peripheral circuit region 102.

The peripheral circuit region 102 may sort the data RGIO_BK1-RGIO_BK1-RGIO_BK0-RGIO_BK1-RGIO_BK0-RGIO_BK0 according to the first and second sorting control signals PIN0 and PIN1 summed by the sorting control signal summation circuit 600, and output the sorted data to the outside of the semiconductor apparatus 100 through the data pads DQ.

Figure 7:
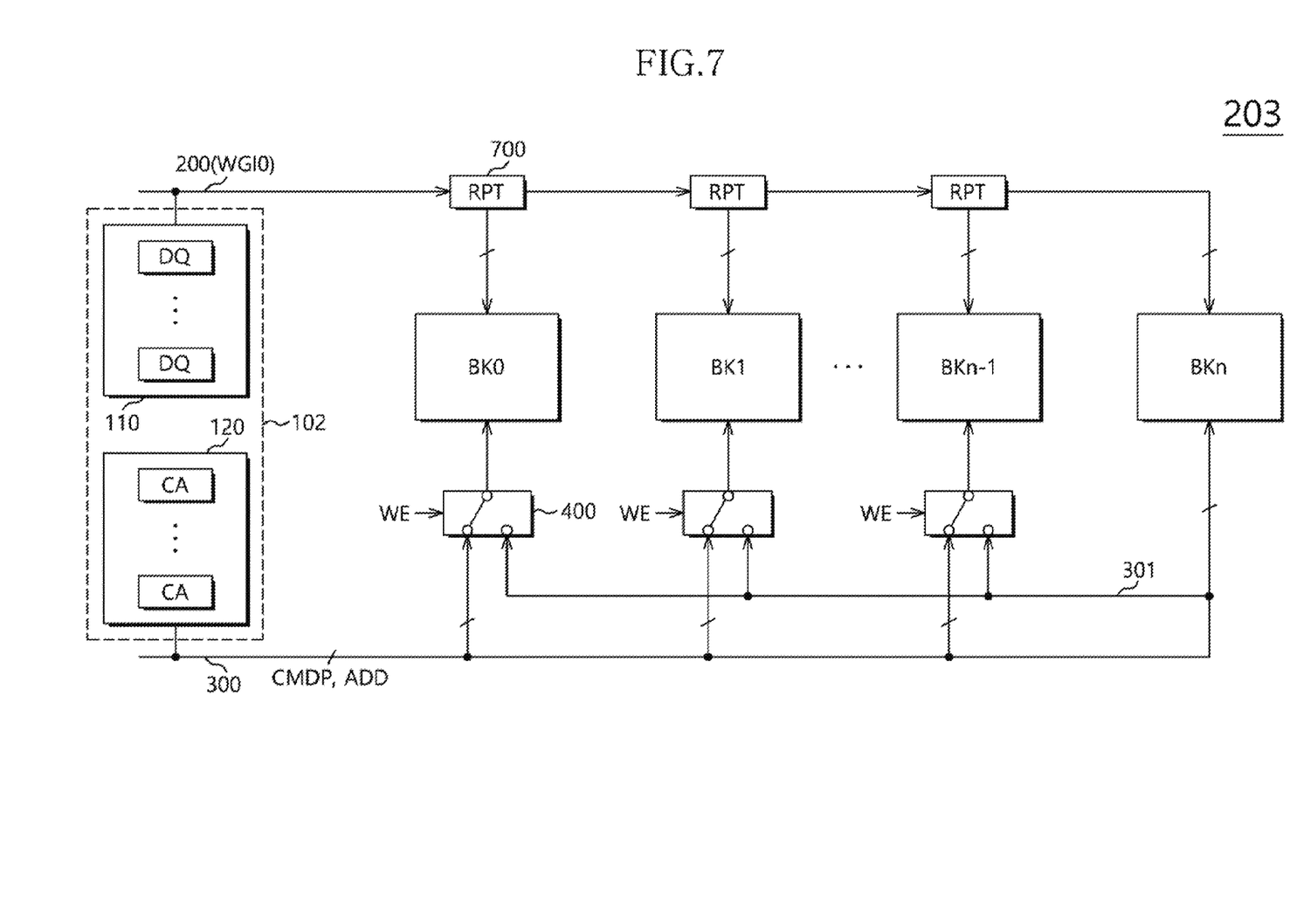
FIGS. 7 and 8 are diagrams illustrating configurations of semiconductor apparatuses in accordance with embodiments.
Figure 8:
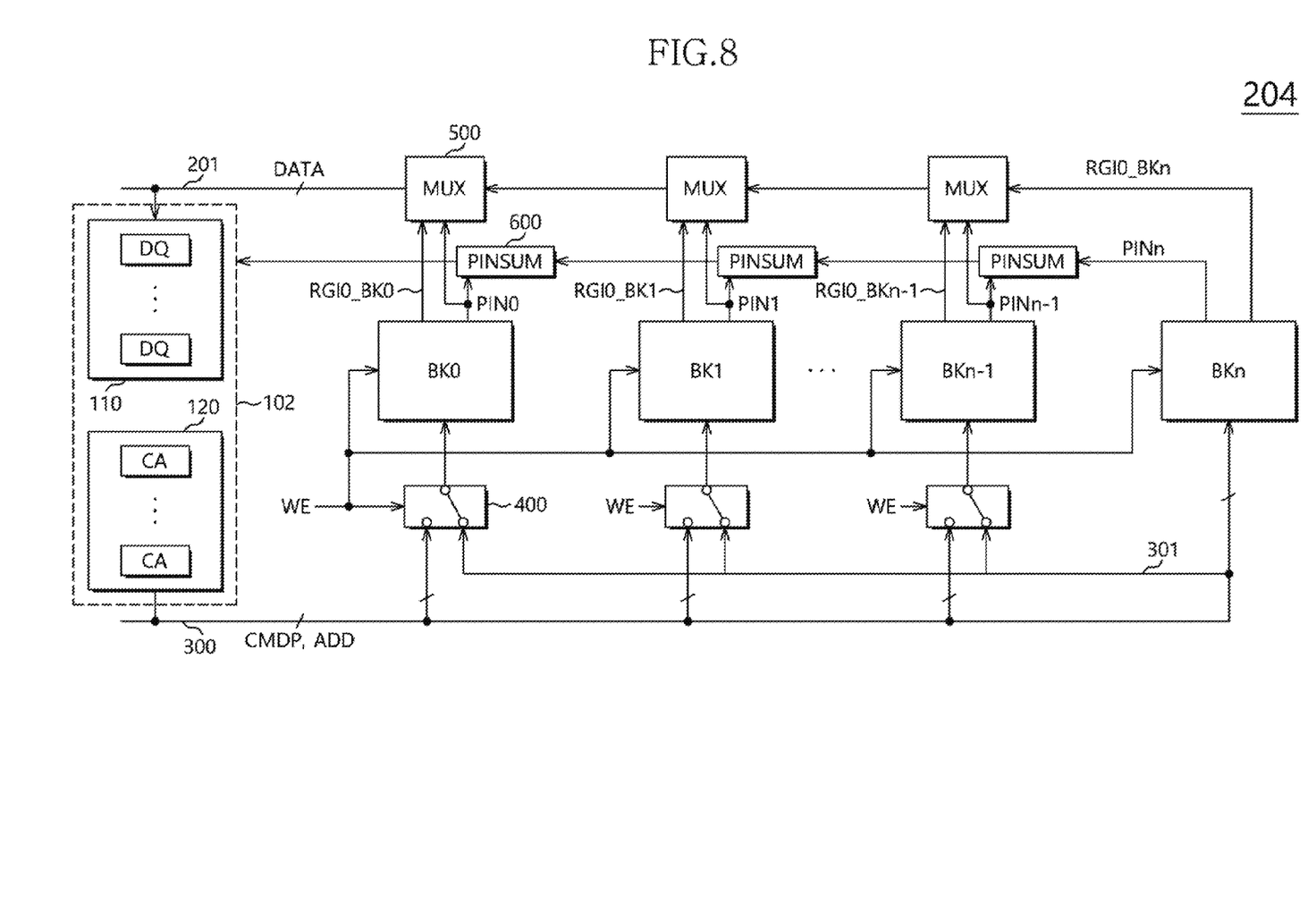

FIGS. 7 and 8 are diagrams illustrating configurations of semiconductor apparatuses in accordance with embodiments.

FIG. 7 illustrates a configuration of a semiconductor apparatus 203 related to a write operation in accordance with an embodiment, showing an example of the semiconductor apparatus 203 including a plurality of memory banks (for example, three or more memory banks).

Referring to FIG. 7, the semiconductor apparatus 203 in accordance with an embodiment may be configured in a similar manner to that of FIG. 2, except that the semiconductor apparatus 203 includes a plurality of memory banks BK0 to BKn, a plurality of switching circuits 400 and a plurality of repeaters (RPT) 700 for compensating for a data level reduction due to an increase in loading of first data lines 200, i.e. an increase in the number of memory banks.

The control signal lines 300 and 301 may be divided into first control signal lines 300 and second control signal lines 301. The first control signal lines 300 may be extended from the peripheral circuit region 102 to the memory bank BKn which is the farthest from the peripheral circuit region 102, and the second control signal lines 301 may diverge from the first control signal lines 300 of the memory bank BKn side to be extended toward the memory bank BK0 which is the closest to the peripheral circuit region 102.

The first data lines 200 and the control signal lines 300 and 301 may be arranged symmetrically with respect to the plurality of memory banks BK0 to BKn.

The semiconductor apparatus 203 in accordance with an embodiment may equalize to the same value a difference between times required for transferring control signals, i.e. a command strobe signal CMDP and an address signal ADD, to the plurality of memory banks BK0 to BKn and a difference between times required for transferring data to the plurality of memory banks BK0 to BKn, through the above-described control signal lines 300 and 301.

Since a write enable signal WE is at a high level during the write operation, the plurality of switching circuits 400 may couple the first control signal lines 300 to the plurality of memory banks BK0 to BKn−1.

Therefore, the command strobe signal CMDP and the address signal ADD may be transferred to the plurality of memory banks BK0 to BKn−1 with time differences in distance order.

That is, the command strobe signal CMDP and the address signal ADD may be sequentially transferred to the plurality of memory banks BK0-BK1, . . . , −BKn−1-BKn from the closest memory bank to the peripheral circuit region 102 to the farthest memory bank from the peripheral circuit region 102.

For example, the command strobe signal CMDP and the address signal ADD may be first transferred to the memory bank BK0 to which data is written for the first time, among the plurality of memory banks BK0 to BKn, and last transferred to the memory bank BKn to which data is written for the last time.

Since the first data lines 200 and the control signal lines 300 and 301 are designed symmetrically with respect to the plurality of memory banks BK0 and BKn, the data transfer time difference and the control signal transfer time difference may be equalized to the same value during the write operation.

FIG. 8 illustrates a configuration of a semiconductor apparatus 204 related to a read operation in accordance with an embodiment, showing an example of the semiconductor apparatus 204 including a plurality of memory banks (for example, three or more memory banks).

Referring to FIG. 8, the semiconductor apparatus 204 in accordance with an embodiment may be configured in a similar manner to that of FIG. 3, except that the semiconductor apparatus 204 includes a plurality of memory banks BK0 to BKn, a plurality of switching circuits 400, a plurality of multiplexers 500 and a plurality of sorting control signal summation circuit 600.

The control signal lines 300 and 301 may be divided into first control signal lines 300 and second control signal lines 301. The first control signal lines 300 may be extended from the peripheral circuit region 102 to the memory bank BKn which is the farthest from the peripheral circuit region 102, and the second control signal lines 301 may diverge from the first control signal lines 300 of the memory bank BKn side to be extended toward the memory bank BK0 which is the closest to the peripheral circuit region 102.

The second data lines 201 and the control signal lines 300 and 301 may be arranged symmetrically with respect to the plurality of memory banks BK0 to BKn.

The semiconductor apparatus 204 in accordance with an embodiment may equalize to the same value a difference between times required for transferring control signals, i.e. a command strobe signal CMDP and an address signal ADD, to the plurality of memory banks BK0 to BKn and a difference between times required for transferring a plurality of output data RGIO_BK0 to RGIO_BKn to the peripheral circuit region 102, through the above-described control signal lines 300 and 301.

Since a write enable signal WE is at a low level during the read operation, the plurality of switching circuits 400 may couple the second control signal lines 301 to the plurality of memory banks BK0 to BKn−1.

That is, the command strobe signal CMDP and the address signal ADD may be sequentially transferred to the plurality of memory banks BKn-BKn−1, . . . , -BK1-BK0 from the farthest memory bank from the peripheral circuit region 102 to the closest memory bank to the peripheral circuit region 102.

For example, the command strobe signal CMDP and the address signal ADD may be first transferred to the memory bank BKn which requires the longest time to read data, among the plurality of memory banks BK0 to BKn, and last transferred to the memory bank BK0 which requires the shortest time to read data.

Since the second data lines 201 and the control signal lines 300 and 301 are designed symmetrically with respect to the plurality of memory banks BK0 and BKn, the data transfer time difference and the control signal transfer time difference may be equalized to the same value during the read operation.

While various embodiments have been described above, it will be understood to those skilled in the art that the embodiments described are examples only. Accordingly, the semiconductor apparatuses described herein should not be limited based on the described embodiments.

What is claimed is:

1. A semiconductor apparatus comprising:
    a peripheral circuit region;
    a switch; and
    a memory region comprising first and second memory blocks located at corresponding first and second separation distances away from the peripheral circuit region, the second separation distance being greater than the first separation distance,
    the first memory block being coupled to the peripheral circuit region by data lines having a first length substantially equal to the first separation distance,
    the second memory block being coupled to the peripheral circuit region by data lines having a second length substantially equal to the second separation distance,
    the second memory block being additionally coupled to the peripheral circuit region by control lines having a second length substantially equal to the second separation distance,
    the switch being configured to selectively couple the first memory block to the peripheral circuit region by control signal lines having either said first length or said second length and thereby selectively provide a control signal propagation time between the peripheral circuit and the first memory block, which is substantially the same as the control signal propagation time between the peripheral circuit region and the second memory block.

2. The semiconductor apparatus according to claim 1, wherein the control signal lines comprise:
    first control signal lines extending from the peripheral circuit region to a memory block, farthest away from the peripheral circuit region; and
    second control signal lines connected to the first control signal lines at a predetermined location and whereat the second control lines diverge away from the first control signal lines of the farthest memory block, and extend therefrom toward a memory block closest to the peripheral circuit region.

3. The semiconductor apparatus according to claim 2, further comprising a switch configured to couple the first control signal lines to one or more memory blocks during a write operation of the semiconductor apparatus.

4. The semiconductor apparatus according to claim 3, wherein the switch couples the second control signal lines to the corresponding memory block during a read operation of the semiconductor apparatus.

5. The semiconductor apparatus according to claim 1, wherein the peripheral circuit region comprises data pads for data input/output with the outside of the semiconductor apparatus and command/address pads for receiving a command and address from the outside of the semiconductor apparatus.

6. The semiconductor apparatus according to claim 1, wherein the control signals comprise a command strobe signal and an address signal.

7. A semiconductor apparatus comprising:
    a peripheral circuit region;
    a memory region comprising first and second memory blocks;
    data lines coupling the peripheral circuit region to the first and second memory blocks in the memory region, said data lines being configured to transfer data from the peripheral circuit region to the first and second memory blocks;
    first control signal lines extending between the peripheral circuit region and the memory block farthest from the peripheral circuit region, the first control signal lines being configured to transfer control signals related to data input/output to the memory block furthest from the peripheral circuit region;
    second control signal lines connected to the first control signal lines at a predetermined location and from which diverge away from the first control signal lines of the farthest memory block to the memory block closest to the peripheral circuit region, the second control signal lines being configured to transfer control signals to said memory block closest to the peripheral circuit region; and
    a switch, configured to couple the second control signal lines to the memory block closest to the peripheral during a write operation of the semiconductor apparatus.

8. The semiconductor apparatus according to claim 7, wherein the peripheral circuit region comprises data pads for data input/output with the outside of the semiconductor apparatus and command/address pads for receiving a command and address from the outside of the semiconductor apparatus.

9. The semiconductor apparatus according to claim 7, wherein the control signals comprise a command strobe signal and an address signal.

10. A semiconductor apparatus comprising:
a peripheral circuit region;
a memory region comprising a plurality of unit memory blocks;
data lines configured to transfer data read from the plurality of unit memory blocks to the peripheral circuit region;
first control signal lines extending between the peripheral circuit region to a memory block farthest from the peripheral circuit region, and configured to transfer control signals related to data input/output to the plurality of unit memory blocks;
second control signal lines connected to and diverging from the first control signal lines of the memory block farthest from the peripheral circuit region toward and connected to the memory block closest to the peripheral circuit region, the second control signal lines being configured to transfer the control signals between the peripheral circuit region and the closest memory block; and
one or more switching circuits configured to couple the second control signal lines to one or more of the plurality of unit memory blocks during a read operation of the semiconductor apparatus.

11. The semiconductor apparatus according to claim 10, wherein the peripheral circuit region comprises data pads for data input/output with the outside of the semiconductor apparatus and command/address pads for receiving a command and address from the outside of the semiconductor apparatus.

12. The semiconductor apparatus according to claim 10, wherein the control signals comprise a command strobe signal and an address signal.

13. A semiconductor apparatus comprising:
a peripheral circuit region;
a memory region comprising a plurality of unit memory blocks;
first data lines configured to transfer data from outside the semiconductor apparatus, through the peripheral circuit region to the plurality of unit memory blocks;
second data lines configured to transfer data that is read from the plurality of unit memory blocks to the peripheral circuit region;
first control signal lines extending from the peripheral circuit region to a farthest from the peripheral circuit region, and which are configured to transfer control signals related to data input/output to the plurality of unit memory blocks;
second control signal lines connected to diverging from the first control signal lines of the farthest unit memory block a memory block closest to the peripheral circuit region, and which are configured to transfer the control signals; and
one or more switching circuits configured to couple the first or second control signal lines to one or more of the plurality of memory blocks according to an operation state of the semiconductor apparatus.

14. The semiconductor apparatus according to claim 13, wherein the peripheral circuit region comprises data pads for data input/output with the outside of the semiconductor apparatus and command/address pads for receiving a command and address from the outside of the semiconductor apparatus.

15. The semiconductor apparatus according to claim 13, wherein the control signals comprise a command strobe signal and an address signal.

16. The semiconductor apparatus according to claim 13, wherein the one or more switching circuits couple the first control signal lines to one or more of the plurality of unit memory blocks during a write operation of the semiconductor apparatus, and couple the second control signal lines to one or more of the plurality of unit memory blocks during a read operation of the semiconductor apparatus.

17. The semiconductor apparatus according to claim 13, wherein the plurality of unit memory blocks generate sorting control signals for defining output timings of output data according to a read operation.

18. The semiconductor apparatus according to claim 17, further comprising one or more multiplexers configured to select and output one of output data of two adjacent unit memory blocks from the plurality of unit memory blocks according to sorting control signals generated through the two adjacent unit memory blocks among the sorting control signals.

19. The semiconductor apparatus according to claim 17, further comprising one or more sorting control signal summation circuits configured to sum the sorting control signals generated through two adjacent unit memory blocks and transfer the summation result to the peripheral circuit region.

* * * * *